United States Patent [19]

Gowan

[11] 3,728,717

[45] Apr. 17, 1973

[54] DIGITAL TO TIME INTERVAL CONVERTER

[75] Inventor: Richard L. Gowan, Bonita, Calif.

[73] Assignee: The United States of America as represented by the Secretary of the Navy

[22] Filed: Dec. 27, 1971

[21] Appl. No.: 212,084

[52] U.S. Cl. ....................... 340/347 DA, 340/347 DD

[51] Int. Cl. ............................................. H03k 13/02

[58] Field of Search ................. 340/347 DA, 347 SY, 340/347 DD

[56] References Cited

UNITED STATES PATENTS

| | | | |
|---|---|---|---|
| 3,488,653 | 1/1970 | Rasche | 340/347 DA |
| 3,490,017 | 1/1970 | Kolell et al. | 340/347 DA |
| 2,907,021 | 9/1959 | Woods | 340/347 DA |
| 3,422,423 | 1/1969 | Kaszynski et al. | 340/347 DA |

*Primary Examiner*—Thomas A. Robinson
*Attorney*—R. S. Sciascia et al.

[57] ABSTRACT

A device for producing a range of precisely known pulse widths by digital decoding. A coded signal representative of the duration of a desired pulse is stored in a register and its leading edge is used to turn on a flip-flop. A stable high frequency pulse source supplies the input to a counter which provides output pulses representative of ten microseconds, one microsecond, and one tenth microseconds. These output pulses are fed into a second register whose output is compared to the output of the first register. When the contents of the two registers are equal the flip-flop is turned off, thereby terminating the pulse.

6 Claims, 3 Drawing Figures

DIGITAL TO TIME INTERVAL CONVERTER

BACKGROUND OF THE INVENTION

The present invention relates to a system for generating a range of precisely known pulse widths and more particularly to a system for generating a range of precisely known pulse widths by digital decoding techniques. In situations such as automatic test systems for shipboard use in the field of stimulus injection it is desirable to have a pulse of precisely known width.

SUMMARY OF THE INVENTION

A binary coded word representing a particular pulse time interval is stored in an input register of a plurality of binary comparators. After loading has been completed in each of the binary comparators, a time interval flip-flop circuit is set true and the time interval generator process begins. Each binary bit-by-bit comparator has the function of controlling the number of time intervals gated out by each of a similar number of time increment decades. These time increment decades are used to control the flow of pulses from the synchronized time increment generator until the proper time lapse has occured and turns off the time interval flip-flop circuit.

It is an object of the present invention to provide an improved pulse generator.

It is another object of the present invention to provide a pulse generator in which a pulse width is digitally controlled.

It is another object of the invention to provide a pulse generator in which the widths of the output pulse are precisely controlled.

Other objects and many of the attendant advantages of this invention will be readily appreciated as the same becomes better understood by reference to the following detailed description when considered in connection with the accompanying drawings.

Figure 1A:
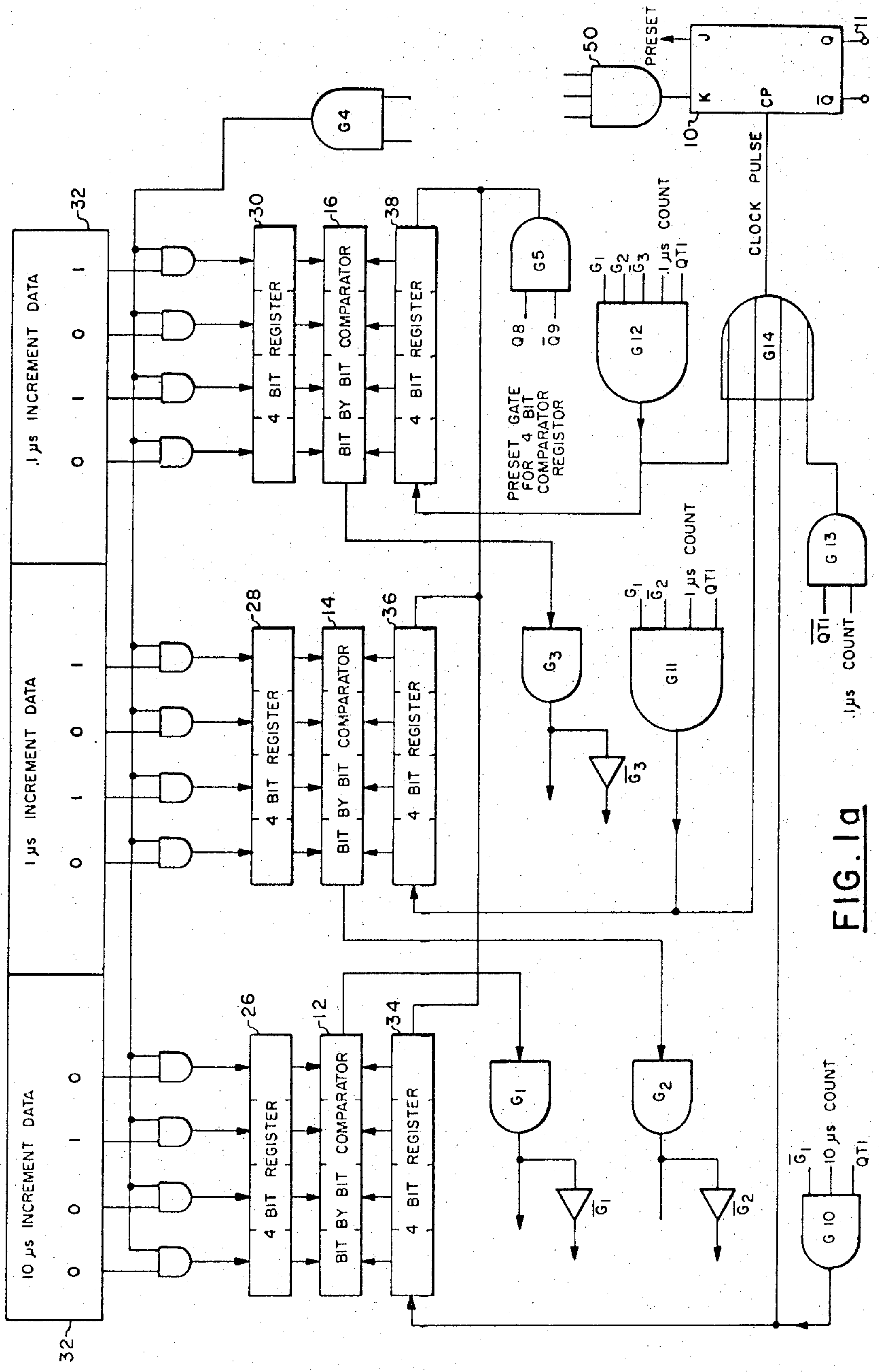
FIGS. 1A and 1B are a block diagram of a preferred embodiment of the invention.
Figure 1B:
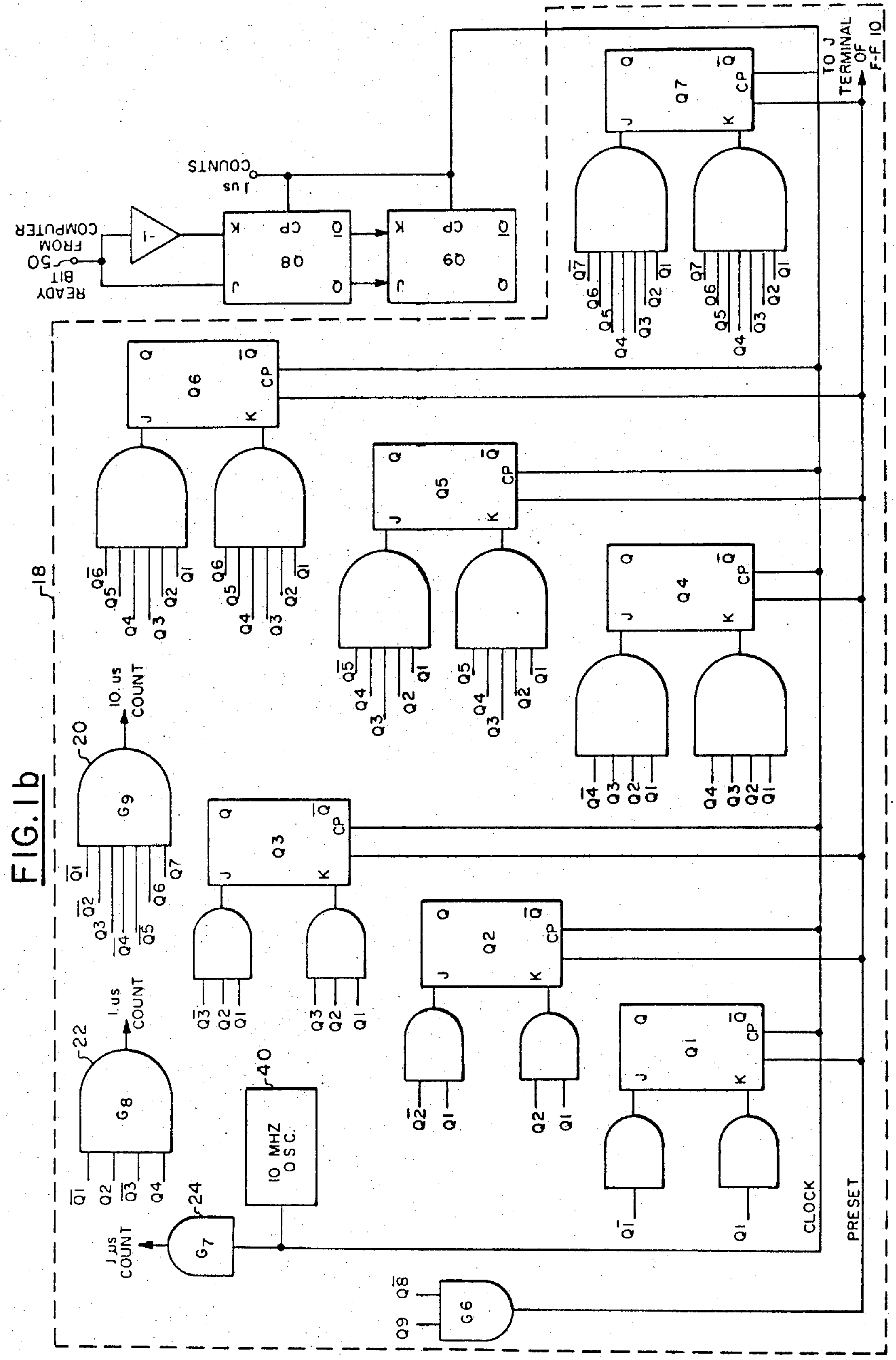

Referring now to the drawings there is shown in the preferred embodiment of FIGS. 1A and 1B a time interval flip-flop 10 for generating the required pulse at output terminal 11. Three binary bit-by-bit comparators 12, 14, and 16, provide a terminating signal for flip-flop 10 when the required time has elapsed. Synchronized time increment generator 18 (FIG. 1B) provides the time increments for comparison to comparators 12, 14, and 16. Each of binary bit-by-bit comparators 12, 14, and 16 has the function of controlling the number of time intervals gated out by each of three time increment decades. These three time increment decades are respectively a 10 microsecond decade 20, a 1 microsecond decade 22 and a 0.1 microsecond decade 24.

Four bit registers 26, 28, and 30 receive and store the binary coded word specifying a particular time interval from computer 32 through AND gates gated on by a gate signal from gate G4. Pulses from the time increment decades 20, 22 and 24 of the synchronized time increment generator 18 are respectively fed into four bit registers 34, 36, and 38 through AND gates G10, G11 and G12.

Synchronized time increment generator 18 provides synchronized pulses since all time increment pulses are derived from 10 MHz oscillator 40.

Figure 2:
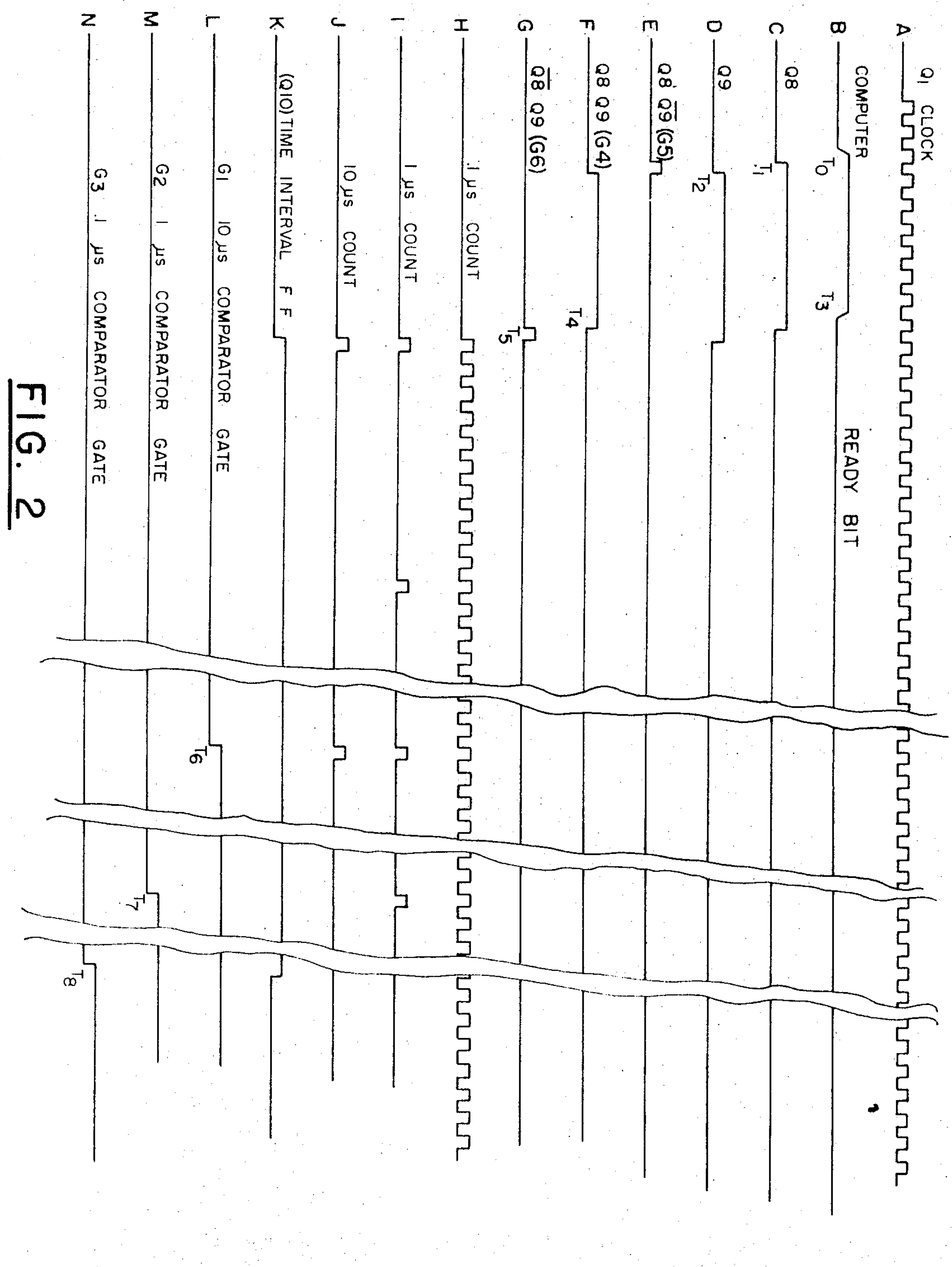
FIG. 2 is a graph of waveforms used in the explanation of the operation of FIGS. 1A and 1B.

Referring now to both FIGS. 1 and 2, waveform A shows the clock pulses generated by 10 MHz oscillator 40. Action is initiated with the receipt at $t_0$ 1 a ready bit signal (waveform B) at input terminal 50 (FIG. 1B) to generate a pulse of a particular time interval, for example, 25.5 msec. Only a single line of the computer message is shown in FIG. 2 for simplicity. One pulse after the computer output data lines are true, control flip-flop Q8 is set true (waveform C), and one clock pulse after Q8 is set true at $t_1$, delay flip-flop Q9 is set true (waveform D). By combining the outputs of flip-flops Q8 and Q9, several gating functions are created. Between $t_a$ and $t_2$ (Q8) (Q9) are fed to AND gate G5 to form a gate signal (waveform E). Gate E is used to clear the four bit input registers 34, 36, and 38 of each time increment decade and prepares them for loading the incoming new data. Between the time $t_2$ and $t_4$, (Q8)(Q9) are fed to gate G4 and form gate pulse (waveform F). Gate G4 is used to load incoming new date from computer 32 to the three input comparator registers 26, 28, and 30. At the expiration of waveform B at $t_3$, the computer message is completed and its data lines are reset to the low state. One clock pulse later at $t_4$, $Q_8$ is reset. One clock pulse after Q8 is reset Q9 is reset. Between the time $t_4$ and $t_5$, ($\bar{Q}8$)(Q9) are fed to gate G6 to form a gate pulse (waveform G). Gate, G6, is used for two purposes. First, the synchronized time increment generator 18 is preset by presetting flip-flops $Q_1$ through $Q_7$ so that complete time increments from the decades 20, 22, and 24 begin at time $t_5$. Second, the J side of time interval flip-flop 10 is set true so that flip-flop 10 is true starting at time $t_5$. Clock pulses for time interval flip-flop 10 are provided by OR gate G14. The logic equation for gate $G_{14}$ is $G_{10} + G_{11} + G_{12} + G_{13}$, between time $t_4$ and $t_5$ the J side of time interval flip-flop 10 is true, and since between time $t_4$ and $t_5$ only gate $G_{13}$ is true, it is this gate that supplies the clock pulse to set flip-flop 10 true at time $t_5$, register 34 begins receiving 10 msec count pulses until comparator 12 senses that the required number of the 10 msec increments (20) has been received. At time $t_6$, there is a match between the input from register 34 and the input from register 26 thereby producing the waveform L which is fed to the gates G10, G11, G12 and 50 allowing the 1 msec pulses to be fed into register 36 until the required number (5) is sensed by comparator 14 and the gate signal, waveform M is fed to gates G11, G12, and 50. Finally, the same sequence takes place for the 0.1 msec time increment decade until comparison is sensed (five 0.1 msec) by comparator 16 at $t_8$ and the gate signal (waveform N) is fed to gates G12 and 50. All three gate signals (waveform L, M and N) are fed to time interval flip-flop 10 which performs the functions of integrating all of the time increments generated by all three decades since it is set true at time $t_5$, the start of the process, and remains true until time $t_8$, the time at which G1, G2, and G3 are all true, the gates being added in AND gate 52, to form the $k$ side logic for flip-flop circuit 10.

Obviously many modifications and variations of the present invention are possible in the light of the above teachings. It is therefore to be understood that within the scope of the appended claims the invention may be practiced otherwise than as specifically described.

What is claimed is:

1. In a digitally controlled pulse width generator the combination comprising:

a. a source of binary coded information representing a particular pulse width,
b. a source of a plurality of synchronized time increments, each of a different time duration,
c. comparator circuit means coupled to said source of binary coded information and to said source of a plurality of synchronized time increments,
d. initiating circuit means being coupled to an input terminal for receiving ready-bit signals and being coupled to said sources and to said comparator circuit means,
e. pulse generating circuit means coupled to said initiating circuit means and to said comparator circuit means and being responsive to the termination of a ready-bit signal to start generating an output pulse for a time duration until a turn-off pulse is received from said comparator circuit means.

2. The converter of claim 1 wherein said comparator circuit means includes three binary bit by bit comparators, each responsive to different time increments from said source of synchronized time increments to match a corresponding digital portion of said binary coded information.

3. The converter of claim 1 wherein said comparator circuit means comprises first, second and third bit-by-bit comparators, each comparator having a first input coupled to a first four bit register which stores the coded information and a second input coupled to a second 4-bit register for receiving synchronized time increments, gate circuit means coupling the output of each of said comparator to said pulse generating circuit means.

4. The converter of claim 3 wherein said gate circuit means includes:

a. a first gate coupled to the output of said first comparator that is set true in response to a match between the first comparator's two inputs,
b. a second gate coupled to the output of said second comparator that is set true in response to a match between the second comparator's two inputs,
c. a third gate coupled to the output of said third comparator that is set true in response to a match between the third comparator's two inputs, and
d. an AND gate coupled to said first, second and third gates and providing a turn-off pulse to said pulse generating circuit means when said first, second and third gates are set true.

5. The converter of claim 4 wherein said pulse generating circuit means is a time interval flip-flop being set true by said initiating circuit means and being turned off when said AND gate is set true.

6. The converter of claim 1 wherein said source of a plurality of synchronized time increments comprises first, second, and third time increment decades driven by a master oscillator providing pulses of a frequency to generate time increments with a duration of the shortest time duration desired.

* * * * *